United States Patent
Weishaar

(10) Patent No.: US 12,169,403 B2
(45) Date of Patent: Dec. 17, 2024

(54) METHOD FOR MONITORING THE VITALITY OF DEVICES OF A DISTRIBUTED SYSTEM

(71) Applicant: Pilz GmbH & Co. KG, Ostfildern (DE)

(72) Inventor: Christoph Weishaar, Ostfildern (DE)

(73) Assignee: Pilz GmbH & Co. KG, Ostfildern (DE)

( * ) Notice: Subject to any disclaimer, the term of this patent is extended or adjusted under 35 U.S.C. 154(b) by 116 days.

(21) Appl. No.: 17/492,148

(22) Filed: Oct. 1, 2021

(65) Prior Publication Data
US 2022/0019208 A1    Jan. 20, 2022

Related U.S. Application Data

(63) Continuation of application No. PCT/EP2020/058834, filed on Mar. 27, 2020.

(30) Foreign Application Priority Data

Apr. 1, 2019   (DE) .......................... 102019108415.6

(51) Int. Cl.
*G05B 23/02*        (2006.01)
*G01R 31/28*        (2006.01)

(52) U.S. Cl.
CPC ..... *G05B 23/0235* (2013.01); *G01R 31/2837* (2013.01); *G05B 23/0291* (2013.01)

(58) Field of Classification Search
CPC ............ G01R 31/2837; G05B 23/0291; G05B 23/0213
See application file for complete search history.

(56) References Cited

U.S. PATENT DOCUMENTS

| | | | | |
|---|---|---|---|---|
| 6,816,746 B2* | 11/2004 | Bickley | .................. | G06Q 10/06 700/109 |
| 2009/0111520 A1* | 4/2009 | Ring | ..................... | G07C 5/008 455/557 |
| 2012/0173054 A1* | 7/2012 | Schwenkel | .......... | G05B 19/058 701/19 |

(Continued)

FOREIGN PATENT DOCUMENTS

| | | |
|---|---|---|
| CN | 109217466 A | 1/2019 |
| DE | 4243882 C1 | 1/1994 |

(Continued)

OTHER PUBLICATIONS

Office Action in corresponding German Patent Application No. 10 2019 108 415.6, dated Apr. 12, 2019, with English translation.

(Continued)

*Primary Examiner* — Santosh R Poudel
(74) *Attorney, Agent, or Firm* — Edell, Shapiro & Finnan, LLC

(57) ABSTRACT

A method for monitoring the vitality of a number of participant devices of a distributed technical system, wherein each of the participant devices has a number of electronic components, comprises: continuously detecting a plurality of physical environmental and/or operating parameters in each of the participant devices and/or in each of the electronic components of the participant devices; storing for retrieval the plurality of physical environmental and/or operating parameters in a vitality data storage device; calculating for each of the electronic components, on the basis of the plurality of physical environmental and/or operating parameters, a number of statistical characteristics that form vitality parameters and that represent at least one of safety, reliability, or the availability of the electronic component; and initiating exception processing in response to a predefined or predefinable threshold value of a statistical characteristic being reached or exceeded.

14 Claims, 2 Drawing Sheets

(56) References Cited

U.S. PATENT DOCUMENTS

| | | | | |
|---|---|---|---|---|
| 2015/0054410 A1* | 2/2015 | Sanders | ............... | H05B 47/20 |
| | | | | 315/185 R |
| 2015/0227122 A1* | 8/2015 | Harkonen | ............... | B66C 13/18 |
| | | | | 700/275 |
| 2016/0041070 A1 | 2/2016 | Wascat et al. | | |
| 2016/0319762 A1* | 11/2016 | Hönl | ............... | F02D 41/22 |
| 2017/0090468 A1 | 3/2017 | Krampe et al. | | |
| 2017/0136547 A1* | 5/2017 | Nakaya | ............... | B23B 3/30 |
| 2017/0293517 A1* | 10/2017 | Dion | ............... | G06N 7/01 |
| 2018/0284748 A1* | 10/2018 | Korsedal, IV | ............... | G05B 23/0205 |
| 2019/0008325 A1* | 1/2019 | Huerta-Ochoa | ............... | A47J 43/082 |
| 2019/0160809 A1* | 5/2019 | Neeb | ............... | B41J 2/0451 |

FOREIGN PATENT DOCUMENTS

| | | |
|---|---|---|
| DE | 102018103232 A1 | 4/2018 |
| EP | 1892597 A1 | 2/2008 |
| EP | 2820490 A1 | 1/2015 |
| WO | 2015104691 A2 | 7/2015 |

OTHER PUBLICATIONS

Search Report in corresponding International Patent Application No. PCT/EP2020/058834, mailed Jun. 3, 2020, with English translation.

Office Action with English translation in European Application No. 20715833.8, issued Sep. 1, 2023, 12 pages.

Notification of the First Office Action with English translation in Chinese Application No. 202080026592.8, dated Dec. 19, 2023, 15 pages.

* cited by examiner

PRIOR ART

METHOD FOR MONITORING THE VITALITY OF DEVICES OF A DISTRIBUTED SYSTEM

CROSS REFERENCE TO RELATED APPLICATIONS

This application is a continuation of International Application No. PCT/EP2020/058834, filed on Mar. 27, 2020, which claims priority under 35 U.S.C. § 119 to Application No. EP 102019108415.6 filed on Apr. 1, 2019, the entire contents of which are hereby incorporated by reference.

TECHNICAL FIELD

The present disclosure relates to a method for monitoring the vitality of one or more participant devices of a distributed technical system.

BACKGROUND

Distributed technical systems are known from the prior art. Such distributed technical systems have a plurality of technical apparatuses, such as, for example, sensors, actuators, control apparatuses, automated machines or robots. These technical apparatuses are connected to a common communication system, in particular, to a bus system or to a communication system, based on an internet protocol, and are in communication with one another via the common communication system, so that a data exchange is possible. Therefore, in the context of the present application, these interconnected technical apparatuses are also very loosely referred to as the participant devices of the distributed technical system. In order to be able to operate the participant devices of such a distributed technical system and/or the distributed technical system cost efficiently, it is necessary for the individual participant devices to operate reliably over a long period of time. Failure of one or more participant devices can result in the entire distributed technical system not working any more or no longer working with sufficient reliability. Distributed technical systems or the participant devices of these distributed technical systems themselves often have a high technical complexity, so that the failure of an electronic component of one of the participant devices can have an adverse effect on the ability of this participant device or of the entire distributed technical system to function properly.

In order to be able to ensure the vitality of the participant devices of distributed technical systems, it is necessary to consider, in addition to safety, also the reliability and the availability of the electronic components installed in the relevant participant devices. These electronic components are exposed to a wide range of environmental and operating influences during operation. In order to quantify the reliability and the availability of the electronic components installed in a participant device and which usually consist of a plurality of parts, a wide variety of statistical characteristics, some of which will be explained below, can be calculated.

In terms of safety, for example, the so-called probability of failure per hour (abbreviated to: PFH) is an important statistical characteristic for the error probability of an electronic component or of a system. The calculation of this characteristic is required, for example, in the IEC 61508 standard. Another statistical characteristic for the error probability, which is also derived from the IEC 61508 standard and which is important in terms of safety, is the so-called probability of failure on demand (abbreviated to: PFD). In addition, a further statistical characteristic, which is relevant in terms of safety, is the so-called mean operating time between dangerous failures for repairable units (abbreviated to: MTBFD). MTBFD is defined in the IEC 60050 (191) standard as an expected value of the operating time between two successive dangerous failures.

Another important statistical characteristic, which represents a measure of the reliability of an electronic component, is the so-called mean operating time between failures for repairable units (abbreviated to: MTBF). This MTBF is defined in the IEC 60050 (191) standard as the expected value of the operating time between two successive failures. In this case the term "operating time" is understood as meaning the operating time between two successive failures of a repairable electronic component.

The so-called mean operating time to failure (abbreviated to: MTTF), which is also referred to as the mean lifetime, is defined, according to the IEC 60050 (191) standard, as the expected value of time to failure. This statistical characteristic is also a measure of the reliability of an electronic component.

This mean operating time to failure (MTTF) can also be used to derive the availability A of an electronic component of a participant device of a distributed technical system. The availability A is given by the formula: A=MTTF/(MTTF+MTTR), where in this case MTTR is the "mean time to repair" for repairable electronic components and denotes the expected value of the repair time.

The statistical characteristics, listed above, can be calculated, in particular, from the knowledge of the failure rates of the electronic components or of the parts, which are installed in the electronic components of the participant devices, the stress profile of the electronic components or parts and the failure mechanisms thereof. These characteristics shall also be referred to below as the vitality parameters, since they give information about the vitality of the participant devices of a distributed technical system.

Additional information about the aforementioned characteristics and, moreover, also requirements for the calculation thereof can be found in the relevant technical norms and standards, such as, for example, EN 61508, EN 62061, EN ISO 13849, EN 50126 and SN 29500.

For example, the mean probability of failure in the case of demands from a group of channels for a two-channel safety-related system, in which each of the channels can trigger a corresponding safety function, is calculated in the EN 61508-62010 standard ("Functional Safety of Electrical/Electronic/Programmable Electronic Safety-Related Systems Part 6: Guidelines on the Application of IEC 61508-2 and IEC 61508-3"), as follows:

$$PFH_G=2((1-\beta_D)\lambda_{DD}+(1-\beta)\lambda_{DU})(1-\beta)\lambda_{DU}t_{ce}+\beta\lambda_{DU}$$

In this case, PFHG denotes the median frequency of a dangerous failure for a group of channels, $\lambda_{DD}$ denotes the rate of detected dangerous failures per hour of a channel of a subsystem, $\lambda_{DU}$ denotes the rate of undetected dangerous failures per hour of a channel of a subsystem, $\beta$ denotes the fraction of undetected failures due to common cause, $\beta_D$ denotes the fraction of failures that have a common cause and that are detected by a diagnostic test, and $t_{ce}$ denotes the mean downtime of a channel.

The values $\lambda_{DD}$ and $\lambda_{DU}$ are determined, in particular, from the failure rates and the stress factors of the parts, installed in the electronic components.

FIG. 1 shows, by way of example, a typical curve of the statistical failure rate per hour (PFH) of a part as a function of time t. It is clear from this illustration that in a first phase (phase I) the failure rate decreases continuously as time progresses, starting from relatively high values at the beginning of start-up. In a second phase (phase II) the failure rate is constant and increases again significantly as the operating time increases in a third phase (phase III). The statistical characteristics, explained above, are valid, assuming a constant failure rate of the parts, as represented by the shape of the curve in FIG. 1 in phase II.

At the end of the expected lifetime of the parts, at which the wear limit is reached and which is shown at the end of phase II in the illustration according to FIG. 1, the relevant electronic components should be replaced or repaired. According to different calculation models, such a replacement or repair occurs, for example, after 10 years or 20 years after the first start-up.

FIG. 2 shows an enlarged representation of the behavior of the statistical failure rate within phase II according to FIG. 1, where the failure rate is constant.

The failure rates of the electronic components of technical apparatuses and, associated therewith, also the failure rates of the technical apparatuses themselves are influenced by different stress factors, under which the relevant technical apparatus and the electronic components and parts, installed therein, are operated in real time. These stress factors include, in particular, operating hours (t)
temperature (T)
electrical supply voltage
moisture.

In the DIN EN 61709:2012 standard ("Electrical Components—Reliability—Reference Conditions for Failure Rates and Stress Models for Conversion") this failure rate is described by the following formula:

$$\lambda_B = \lambda_{ref} * \pi U * \pi I * \pi T * \pi E * \pi S * \pi ES$$

In this case:
$\lambda_B$ denotes the failure rate of the part, taking into account specific load factors,
$\lambda_{ref}$ denotes the failure rate at reference conditions,
$\pi U$ denotes the factor for voltage dependence,
$\pi I$ denotes the factor for current dependence,
$\pi T$ denotes the factor for temperature dependence,
$\pi E$ denotes the factor for dependence on environmental conditions,
$\pi S$ denotes the factor for dependence on the switching frequency,
$\pi ES$ denotes the factor for dependence on the electrical load.

Qualitative and quantitative analyses of the temperature dependence have shown, for example, that in a first approximation a temperature increase of 10 K leads to a doubling of the expected failure rate.

The statistical description and the evaluation can be carried out, in particular, via a so-called Weibull distribution.

The service life, which considers the error accumulation of undetected errors, is primarily influenced by the operating hours (t).

The wear limit of a technical apparatus is reached, when the failure rate of technical apparatuses that have been in operation for a long period of time increases, compared to other technical apparatuses that have been in operation for only a short time.

The manufacturers of electronic components for technical apparatuses must determine the corresponding characteristics for these components and must provide them to the customer.

Since the components, such as, for example, memory-programmable controllers or industrial controllers, which are installed in the technical apparatuses, can often be used for a wide variety of applications, there is the problem that, when the aforementioned characteristics are specified, the application-specific operating conditions, such as, for example, the operation in an air conditioned control cabinet, which can have a positive effect on the service life, are not taken into account.

Therefore, the aforementioned statistical characteristics have to be calculated by the manufacturer assuming a "worst-case" scenario, in which, for all applications and areas of use, the worst case is assumed in each case. However, this worst case is, in fact, generally true only for some of the applications and areas of use.

SUMMARY

The object of the disclosed method is to provide for the monitoring of the vitality of a number $n \geq 1$ of participant devices of a distributed technical system. The method makes it possible to determine continuously statistical characteristics, which represent the safety and/or the reliability and/or the availability of at least one participant device and which form vitality parameters, individually in the course of the life cycle of the at least one participant device and, thus, to reflect the use under real conditions.

In an inventive method for monitoring the vitality of a number $n \geq 1$ of participant devices of a distributed technical system, wherein each of the participant devices has a number of electronic components, it is provided that a plurality of physical environmental and/or operating parameters are continuously detected in each of the participant devices and/or in each of the electronic components of the participant devices and are stored for retrieval in a vitality data storage device. For each of the electronic components a number $m \geq 1$ of statistical characteristics, which represent the safety and/or the reliability and/or the availability of the relevant component and form vitality parameters, are calculated, in particular, on the basis of the detected environmental and/or operating parameters. Furthermore, when a predefined or predefinable threshold value of the relevant statistical characteristic is reached or exceeded, an exception processing is initiated. This exception processing may result, for example, in the output of a diagnostic message or in the shutdown of individual participant devices.

The disclosed method enables a systematic, reliable and, in particular, also early detection in an advantageous way, when a technical apparatus, which forms a participant device of the distributed technical system, or the electronic components, installed in this technical apparatus, reach or exceed the threshold values of safety and/or reliability and/or availability, so that faults or failures are to be expected with high probability. In the individual case, therefore, under favorable environmental and/or operating conditions it is possible to continue to operate a technical apparatus or a population of comparable technical apparatuses in an advantageous way for a longer period of time and, as a result, in particular, from an economic point of view. Hence, in the individual case a preventive exchange of the technical apparatus could occur much later than in the case of rigid exchange intervals that are based on the consideration of "worst case" scenarios. In this case the disclosed method takes advantageously into account real operating and environmental influences, to which the at least one participant device of the distributed technical system is actually exposed during real time operation. In the case of the statistical characteristics, which represent the safety and/or the reliability and/or the availability of a participant device of the distributed technical system and which are also referred to below as the vitality parameters, they may be, in particular, one or more of the statistical characteristics, explained in detail in the introduction. Therefore, they will not be explained once again at this point.

A technical apparatus, which forms a participant device of a distributed technical system in the context of the present disclosure, or a population, consisting of a plurality of, preferably comparable, technical apparatuses, is considered to be reliable, in particular, under the conditions listed below:

The constant failure rates, which can be represented, in particular, by the statistical characteristics MTBF, MTBFD and PFH explained above (see FIG. 1), are not inadmissibly high.

Errors, which are not detected via error accumulation, may not leave the permissible safety level range (PFH_threshold). In this case the reference here is to the service life (see FIG. 2) of a technical apparatus. A functional test is used to disclose all of the undetected errors. On elimination of the errors, the technical apparatus is considered to be "like new" and, consequently, may also continue to be operated.

The wear limit or the end of the lifetime (see FIG. 1, end of phase II and transition to phase III), in which the constant failure rate is no longer present, has not been reached yet. The characteristic numbers, which the manufacturer gives for its electronic components, can be guaranteed only for the time of the constant failure rate.

In a preferred embodiment it is proposed that the calculated vitality parameters be stored for retrieval in the vitality data storage device. This aspect allows the vitality parameters to be accessed at a later date. Preferably the measured operating and/or environmental parameters can also be stored for retrieval in the vitality data storage device, so that they can be correlated with the vitality parameters. The vitality data storage device may be, for example, any component-internal storage device, which is typical of electronic components, such as, for example, a RAM memory, a flash memory, a hard disk memory, or the like. As an alternative, the vitality data storage device can also be designed decentrally as cloud storage. As a general rule, a combination of the component-internal storage device with cloud storage is also possible. As a result, a higher data integrity is obtained.

In a preferred embodiment it is proposed that algorithms, which calculate the vitality parameters of the electronic components and monitor the threshold values of the vitality parameters, be executed in each of the participant devices. Preferably, the participant devices can initiate the exception processing. As an alternative, the exception processing can also be initiated in a higher ranking monitoring process.

In another alternative embodiment, it is provided that the environmental and/or operating parameters are transmitted to a decentralized monitoring apparatus, in which algorithms, which calculate the vitality parameters of the electronic components of the participant devices and monitor the threshold values of the vitality parameters, are executed. This aspect has the advantage that for calculating the vitality parameters and for monitoring the threshold values of the vitality parameters in the electronic components and in the participant devices, there is no need to maintain any computing capacities at all. In this context, it has been found to be expedient for the decentralized monitoring apparatus to initiate the exception processing.

The monitoring process carried out in the monitoring apparatus classifies preferably the environmental and/or operating parameters of the participant devices into classes of the same or comparable load profiles. From the data of the corresponding load profile, it is possible to derive information for the individual participant device, an aspect that is not possible if just the environmental and/or operating parameters of the individual participant device are known. For example, application-specific load profiles of participant devices such as, for example, robot apparatuses, cable cars or wind power plants, can be created. The knowledge of the load profile assigned to the participant device and the individual behavior of the environmental and/or operating parameters of the relevant participant device can be used, if necessary, to initiate measures such as, for example, the output of a diagnostic message, a restriction of the safety integrity or a shutdown of the relevant participant device.

In an advantageous embodiment, there is the possibility that the operating conditions of the participant device or all of the participant devices of the distributed technical system that are affected by the exceedance of the threshold value are restricted by initiating the exception processing. In one advantageous embodiment, the initiation of the exception processing allows the participant device or all of the participant devices of the distributed technical system that are affected by the exceedance of the threshold value to be shut down. As an alternative, the initiation of the exception processing allows the participant device or all of the participant devices of the distributed technical system that are affected by the exceedance of the threshold value to continue to operate for a limited period of time.

In an advantageous further development of the method, it is possible for system resources within the distributed technical system to be dynamically allocated to the participant devices. In this case the resource distribution takes place as a function of the vitality parameters.

The long-term "in-situ" monitoring, proposed herein, of the vitality (i.e., the operability) of one or more participant devices of a distributed technical system during operation offers, in particular, the following technical and also economic advantages:

In a distributed technical system within which the system resources are dynamically allocated, tasks can be allocated only to functional, vital participant devices. In this case, an allocation of resources can be made preferably to the participant device rated as the most vital on the basis of the vitality parameters and currently has free system resources.

If the environmental conditions or operating conditions change such that a participant device of the distributed technical system leaves its defined operating conditions, then the participant device can generate in an advantageous embodiment a corresponding message as a preventive measure. Furthermore, suitable measures can be taken, so that no failure of the participant device or incorrect control of processes of the distributed technical system, in which the participant device is involved, can occur. The message may be an optical or acoustic message, which can be perceived by the operating personnel, or may be a message in electronic form that can be further processed with a data processor.

If a participant device of a distributed technical system fails, for example due to a defect in an electronic component, and is subsequently sent to the manufacturer for error analysis or repair, the real operating conditions of the participant device can be read from the history of its vitality data storage device, in which the vitality parameters and preferably also the associated operating and environmental parameters are stored. As a result, it can be seen, for example, whether the relevant participant device has been operated possibly outside its specified temperature range in the course of its operating history.

To date, the calculation of statistical characteristic numbers of electronic components has been based on a "worst case" assumption with respect to the operating hours per year and the stress profile under which the relevant participant device is operated. An evaluation of the vitality parameters and the underlying measured data, in particular the real operating hours and the temperature, can be used advantageously to operate the participant devices of the distributed technical system for a longer period to time.

It is possible, for example, to prove quantitatively the operating reliability by evaluating a representative sample. For example, safe and non-safe failures per hour can be detected and correlated with the normatively required maximum allowable failure rates (PFH values) according to the EN 61508 standard.

BRIEF DESCRIPTION OF THE DRAWINGS

Other features and advantages of the disclosed method will become apparent from the following description of preferred exemplary embodiments with reference to the accompanying drawings, which show in FIG. 1 is a typical curve of the statistical failure rate per hour (PFH) of a part, a component or a system as a function of time t.

DETAILED DESCRIPTION

Figure 1:
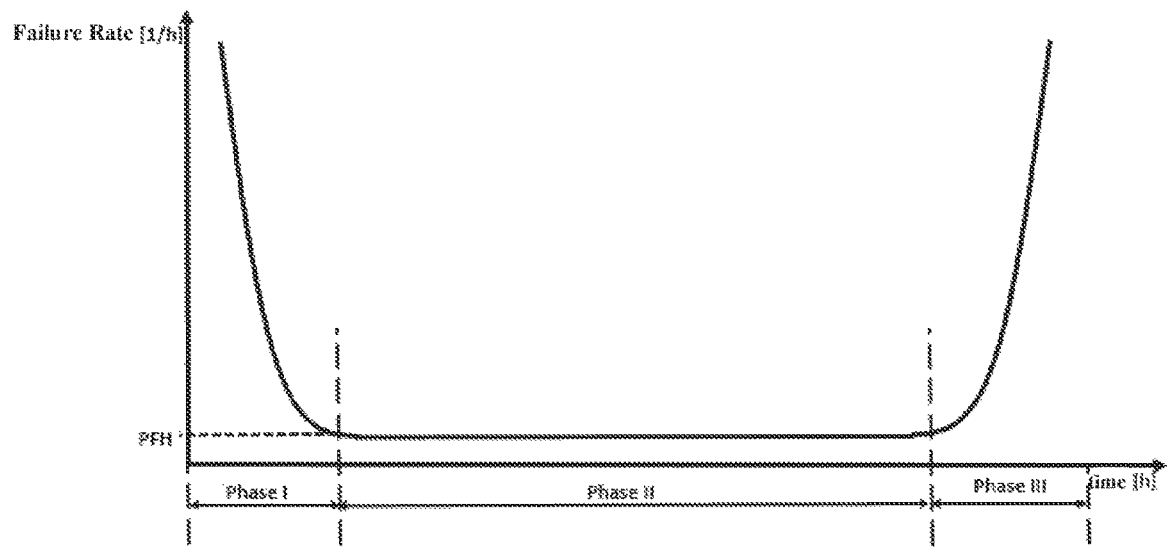
Figure 2:
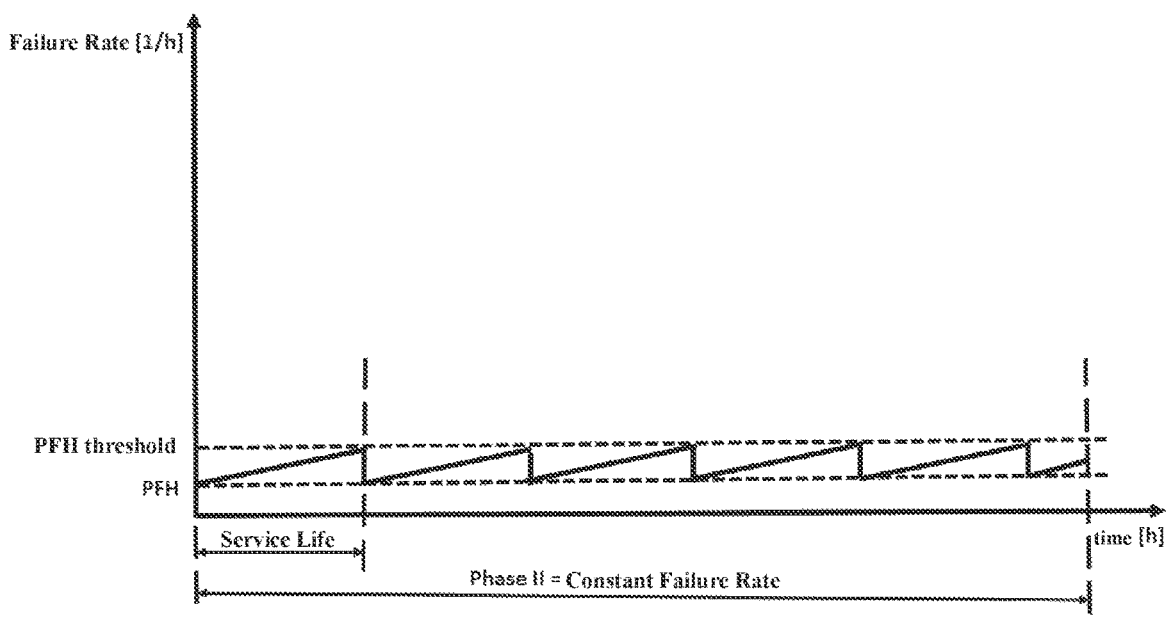
FIG. 2 illustrates on an enlarged scale the behavior of the statistical failure rate per hour (PFH) within phase II from FIG. 1, in which the failure rate is constant.
Figure 3:
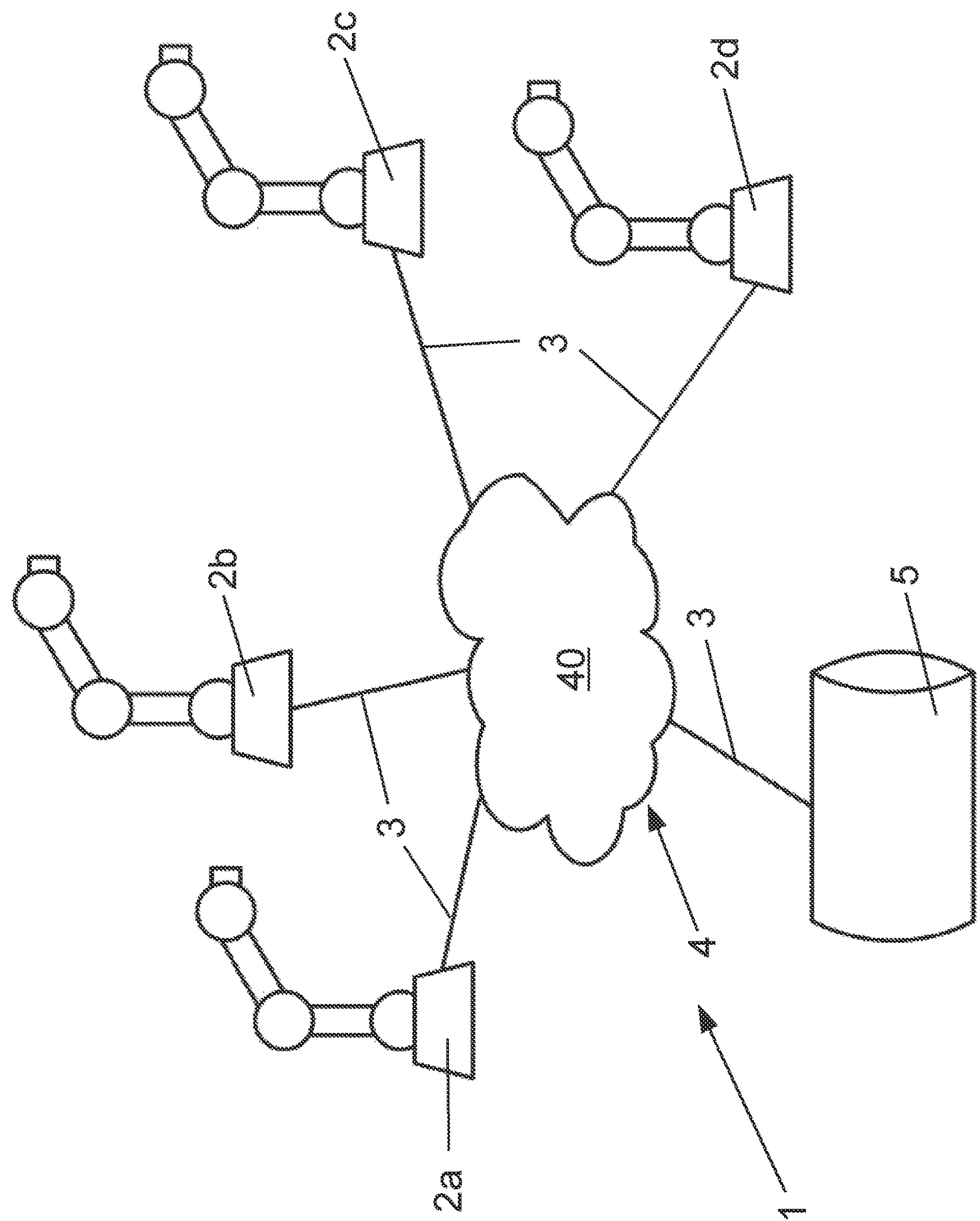
FIG. 3 illustrates in schematic form a highly simplified representation of a distributed technical system comprising a plurality of participant devices.

With reference to FIG. 3, the basic structure of a distributed technical system 1 comprising a plurality of technical apparatuses, which will also be referred to below as the participant devices 2a, 2b, 2c, 2d of the distributed technical system 1, as well as the details of a method for monitoring the vitality of at least one of the participant devices 2a, 2b, 2c, 2d, will be explained in greater detail below. In the exemplary embodiment shown here, the participant devices 2a, 2b, 2c, 2d of the distributed technical system 1 are robot apparatuses. The participant devices 2a, 2b, 2c, 2d are connected to a common communication system 3, in particular, to a bus system or to a communication system based on an internet protocol and are in communication with one another via the common communication system so that a data exchange is possible.

Each of the participant devices 2a, 2b, 2c, 2d has one or more electronic components that in turn comprise one or more semiconductor chips and/or one or more passive parts, which detect fail-safe the physical environmental parameters and/or operating parameters, which are detected by a corresponding detector, in particular, a sensor, as a function of time and can store them in a vitality data storage device 4. The storage may take place, for example, in any component-internal storage device, which is typical of electronic components, such as, for example, a RAM memory, a flash memory, a hard disk memory or the like. In this exemplary embodiment the vitality data storage device 4 is designed decentrally as cloud storage 40. As a general rule, a combination of the component-internal storage devices with cloud storage 40 is also possible. In this case, the vitality data can be stored in both the storage devices of the electronic components of the participant devices 2a, 2b, 2c, 2d and in the cloud storage 40. The participant devices 2a, 2b, 2c, 2d of the distributed technical system 1, where the participant devices are designed as robot apparatuses in the present case, are provided with a control apparatus, preferably with a safety control apparatus, which forms an electronic component of the relevant participant device 2a, 2b, 2c, 2d in the aforementioned context.

Each of the electronic components of the participant devices 2a, 2b, 2c, 2d has a communication interface in order to make the measured environmental parameters and/or operating parameters available to the cloud storage 40 and from there to a higher ranking monitoring process. This monitoring process can be implemented, for example, centrally in each of the participant devices 2a, 2b, 2c, 2d for all of the electronic components of the relevant participant device 2a, 2b, 2c, 2d.

In the exemplary embodiment shown in FIG. 3, the monitoring process is carried out in a higher ranking monitoring apparatus 5, which can access the environmental parameters and/or operating parameters, which are stored in the cloud storage 40, and which are associated with the electronic components of the participant devices 2a, 2b, 2c, 2d of the distributed technical system 1. The monitoring process, carried out by the monitoring apparatus 5, is software-based and comprises algorithms, by which for each of the electronic components of the participant devices 2a, 2b, 2c, 2d a number $m \geq 1$ of statistical characteristics, which increase the safety and/or the reliability and/or the availability of the relevant component, are calculated continuously (as a function of time) on the basis of the measured environmental parameters and/or operating parameters and optionally on the basis of further input variables and/or model variables. These statistical characteristics, which have already been described in detail above, will also be referred to below as the vitality parameters. In this exemplary embodiment, the participant devices 2a, 2b, 2c, 2d or, more specifically, the electronic components of the participant devices 2a, 2b, 2c, 2d provide only the detected physical environmental parameters and/or operating parameters, which are measured as a function of time. These statistical characteristics are then transmitted from the cloud storage 40 to the monitoring apparatus 5 and further processed and evaluated by the monitoring apparatus. Furthermore, the monitoring process, which is carried out by the monitoring apparatus 5, also includes algorithms that are capable of monitoring an exceedance of certain threshold values of the vitality parameters. These threshold values can pertain, for example, to the failure rate, the service life and the lifetime of the electronic components installed in the participant devices 2a, 2b, 2c, 2d.

If a vitality parameter of an electronic component of one of the participant devices 2a, 2b, 2c, 2d of the distributed technical system 1 reaches or exceeds a critical threshold value, then the monitoring apparatus 5 initiates an exception processing in the affected participant device 2a, 2b, 2c, 2d. This exception processing can pertain to all of the participant devices 2a, 2b, 2c, 2d or only to the actually affected electronic component of the participant device 2a, 2b, 2c, 2d. For example, in this exception processing the affected electronic component of the participant device 2a, 2b, 2c, 2d can be brought to a special operating state. Preferably, the calculated vitality parameters can also be stored for retrieval in the vitality data storage device 4, which is formed by the cloud storage 40 in the present case.

As an alternative, a monitoring process can also be implemented in each of the participant devices 2a, 2b, 2c, 2d of the distributed technical system 1. The monitoring process is able to calculate continuously a number m≥1 of statistical characteristics, which represent the safety and/or the reliability and/or the availability of the relevant component (vitality parameters), and to detect the attainment or exceedance of a threshold value. If one of the threshold values of the vitality parameters is reached or exceeded, an internal exception processing is initiated within the affected component. For example, in this case the affected electronic component can be brought to a special operating state.

As an alternative, a monitoring process can also be implemented in each electronic component of the participant devices 2a, 2b, 2c, 2d of the distributed technical system 1. The monitoring process is able to calculate continuously a number m≥1 of statistical characteristics, which represent the safety and/or the reliability and/or the availability of the relevant component (vitality parameters), and to detect the attainment or exceedance of a threshold value. If one of the threshold values of the vitality parameters is exceeded, an exception processing is initiated in a higher ranking process, which is implemented in the relevant participant device 2a, 2b, 2c, 2d or in the monitoring apparatus 5. The exception processing can pertain to all of the participant devices 2a, 2b, 2c, 2d or only to the actually affected electronic component of the participant device 2a, 2b, 2c, 2d or to the entire distributed technical system 1.

Within the framework of the exception processing the operating conditions of a single participant device 2a, 2b, 2c, 2d or a plurality of participant devices 2a, 2b, 2c, 2d of the distributed technical system 1 can be restricted. This restriction may result in a single participant device 2a, 2b, 2c, 2d or a plurality of participant devices 2a, 2b, 2c, 2d of the distributed technical system 1 being shut down or the affected participant device 2a, 2b, 2c, 2d or the affected participant devices 2a, 2b, 2c, 2d being allowed to continue to operate for a limited period of time. The restriction may result in the safety integrity of the affected participant device 2a, 2b, 2c, 2d or a plurality of participant devices 2a, 2b, 2c, 2d being downgraded to a lower level.

The monitoring process carried out in the monitoring apparatus 5 classifies preferably the environmental and/or operating parameters of the participant devices 2a, 2b, 2c, 2d into classes of the same or comparable load profiles. From the data of the corresponding load profile, it is possible to derive information for the individual participant device 2a, 2b, 2c, 2d, an aspect that is not possible if just the environmental and/or operating parameters of the individual participant device 2a, 2b, 2c, 2d are known. For example, application-specific load profiles of participant devices 2a, 2b, 2c, 2d, such as, for example, robot apparatuses, cable cars or wind power plants, can be created. From the knowledge of the load profile, assigned to the participant device 2a, 2b, 2c, 2d, and from the individual behavior of the environmental and/or operating parameters of the relevant participant device 2a, 2b, 2c, 2d, measures, such as, for example, the output of a diagnostic message, a restriction of the safety integrity or a shutdown of the relevant participant device 2a, 2b, 2c, 2d, are introduced, if necessary.

The content of the vitality data storage device 4, which in the present case is formed by the cloud storage 40, and the serial numbers of the participant devices 2a, 2b, 2c, 2d are transmitted at regular time intervals to the central monitoring apparatus 5 or another server apparatus for evaluating and storing. Preferably, the user is given the option of supplementing the history of the environmental parameters and operating parameters, which are stored in the vitality data storage device 4, with information, which is recognized at the user level.

What is claimed is:

1. A method for monitoring the vitality of one or more participant devices of a distributed technical system, wherein each of the participant devices has one or more electronic components, the method comprising:
   continuously detecting a plurality of physical environmental and/or operating parameters in each of the participant devices and/or in each of the electronic components of the participant devices;
   storing for retrieval the plurality of physical environmental and/or operating parameters in a vitality data storage device; and
   in a monitoring process performed by a monitoring device or by each of the participant devices:
      calculating for each of the electronic components, on the basis of the plurality of physical environmental and/or operating parameters, one or more statistical characteristics that form vitality parameters and that represent at least one of safety, reliability, or the availability of the electronic component; and
      in response to reaching or exceeding a predefined or predefinable threshold value of at least one of the statistical characteristics, initiating exception processing comprising: restricting operating conditions of or shutting down the participant device for which the threshold value was reached or exceeded; or restricting operating conditions of or shutting down all participant devices of the distributed technical system,
   wherein the method for monitoring further comprises:
      allocating system resources within the distributed technical system dynamically among the participant devices based on the calculated vitality parameters during operation of the distributed technical system,
      classifying the physical environmental and/or operating parameters of each participant device into classes of comparable or same load profiles,
      creating application-specific load profiles based on the comparable or same load-profiles for each of the participant devices, and
      initiating measures to restrict or shutdown at least one of the participant devices based on the application-specific load profiles assigned to each of the participant devices,
   wherein the allocation of the system resources is made to the participant device which is rated most vital on the basis of the vitality parameters.

2. The method of claim 1, further comprising storing the calculated vitality parameters for retrieval in the vitality data storage device.

3. The method of claim 1, further comprising executing, in each of the participant devices, algorithms that calculate the vitality parameters of the electronic components and that monitor the threshold values of the vitality parameters.

4. The method of claim 3, wherein the exception processing is initiated by the participant devices.

5. The method of claim 3, wherein the exception processing is initiated in a higher-ranking monitoring process.

6. The method of claim 1, further comprising:
transmitting the physical environmental and/or operating parameters to a decentralized monitoring apparatus; and
executing, in the decentralized monitoring apparatus, algorithms that calculate the vitality parameters of the electronic components of the participant devices and that monitor the threshold values of the vitality parameters.

7. The method of claim 6, wherein the exception processing is initiated by the decentralized monitoring apparatus.

8. The method of claim 1, wherein restricting operating conditions of the participant device for which the threshold value was reached or exceeded comprises allowing operation of the participant device to continue for a limited period of time.

9. The method of claim 1, wherein restricting operating conditions of the participant device for which the threshold value was reached or exceeded comprises downgrading the participant device to a lower level of operation.

10. The method of claim 1, wherein restricting operating conditions of all participant devices of the distributed technical system comprises allowing operation of all participant devices to continue for a limited period of time.

11. The method of claim 1, wherein restricting operating conditions of all participant devices of the distributed technical system comprises downgrading all participant devices to a lower level of operation.

12. The method of claim 1, wherein the vitality data storage device comprises an internal storage device of the electronic components.

13. The method of claim 1, wherein the vitality data storage device comprises a decentralized cloud storage device.

14. The method of claim 1, wherein the vitality data storage device comprises an internal storage device of the electronic components in combination with a decentralized cloud storage device.

* * * * *